(12) United States Patent
Bucceri

(10) Patent No.: US 12,640,769 B2
(45) Date of Patent: May 26, 2026

(54) HIGH POWER MICROWAVE DIFFERENTIAL SINGLE POLE DOUBLE THROW

(71) Applicant: BAE Systems Information and Electronic Systems Integration Inc., Nashua, NH (US)

(72) Inventor: John Bucceri, Londonderry, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 476 days.

(21) Appl. No.: 18/296,806

(22) Filed: Apr. 6, 2023

(65) Prior Publication Data

US 2024/0340038 A1 Oct. 10, 2024

(51) Int. Cl.
 H04B 1/44 (2006.01)
 H03K 17/56 (2006.01)
(52) U.S. Cl.
 CPC ............... H04B 1/44 (2013.01); H03K 17/56 (2013.01)

(58) Field of Classification Search
 CPC . H04B 1/38; H04B 1/40; H04B 1/401; H04B 1/44; H03K 17/51; H03K 17/56; H03K 17/6221
 See application file for complete search history.

(56) References Cited

U.S. PATENT DOCUMENTS

| | | | | |
|---|---|---|---|---|
| 5,109,205 A * | 4/1992 | Hart | ........................... | H01P 1/15 |
| | | | | 333/262 |
| 9,356,017 B1 * | 5/2016 | Siemieniec | .......... | H10D 30/475 |
| 10,396,715 B2 * | 8/2019 | Austin | ................. | H04B 1/0064 |
| 10,673,412 B1 * | 6/2020 | Weale | .................. | H04B 1/0458 |
| 10,840,341 B2 * | 11/2020 | Radosavljevic | ....... | H10D 30/47 |
| 11,557,539 B1 * | 1/2023 | Romanczyk | ............ | H01L 23/36 |

* cited by examiner

*Primary Examiner* — Quochien B Vuong
(74) *Attorney, Agent, or Firm* — Sand, Sebolt & Wernow LPA; Gary McFaline

(57) ABSTRACT

High power monolithic microwave integrated circuit (MMIC) differential single pole double throw switches utilizing a series of transistors formed by a gallium nitride (GaN) foundry process. The differential switches of the present disclosure allow for larger power handling capability and wideband operation while further providing differential amplitude and phase matching.

15 Claims, 4 Drawing Sheets

HIGH POWER MICROWAVE DIFFERENTIAL SINGLE POLE DOUBLE THROW

TECHNICAL FIELD

The present disclosure relates generally to the field of differential switching components for electromagnetic transmission and signal reception. More particularly, in one example, the present disclosure relates to a high power monolithic microwave integrated circuit (MMIC) differential single pole double throw switch. Specifically, in another example, the present disclosure relates to a high power double throw MMIC differential switch utilizing a series of transistors formed by a gallium nitride foundry process to provide a switch operable within a broad frequency range and capable of handling higher power levels.

BACKGROUND

Electromagnetic transmitting and receiving systems, including those utilizing microwaves or similar wavelength signals, are commonly divided into separate transmit and receive chains. Historically, these chains are singularly configured; i.e. a single chain is utilized for transmitting a signal while a separate single chain is utilized for receiving similar signals. Typically, these singularly configured transmit and receive chains are operated utilizing single-ended components and are configured for whichever individual chain (e.g. transmit or reception) to which the single-ended components are linked.

While these single-ended chains tend to provide minimal self-interference, they lack flexibility and adaptability for evolving electromagnetic transmission and receiving systems. In particular, as more advanced systems come online, the ability to transmit to, and receive from, these advanced and more agile systems require better adaptability across multiple frequency ranges. Further, the limited power handling capabilities of current transmit and/or receive chains limit the effective range and operational abilities of the system as a whole.

Specifically, many existing differential switches are not fully wideband and do not cover what is generally referred to as the mid-band frequencies (approximately 2 to 18 GHZ). Further, existing differential switches do not functionally address phase and amplitude matching requirements needed for coherent beam forming and general array usage. Similarly, current commercially available differential switches are only capable of handling up to three or four watts of maximum power and tend to operate only in frequencies below approximately 6 GHz. Thus, these existing switches are lacking in both frequency range and power handling capabilities.

SUMMARY

The present disclosure addresses these and other issues by providing high power monolithic microwave integrated circuit (MMIC) differential single pole double throw switches utilizing a series of transistors formed by a gallium nitride (GaN) foundry process. The differential switches of the present disclosure allow for larger power handling capability and wideband operation while further providing differential amplitude and phase matching.

In one aspect, an exemplary embodiment of the present disclosure may provide a differential switch comprising: an input; a first output having at least one gallium nitride (GaN) based transistor in operable connection therewith; a second output at least one additional GaN based transistor in operable connection therewith; and at least three direct current (DC) block capacitors, with at least one of the at least three DC block capacitors in operable connection with the input, at least one of the at least three DC block capacitors in operable connection with the first output, and at least one of the at least three DC block capacitors in operable connection with the second output. This exemplary embodiment or another exemplary embodiment may further provide wherein the at least three DC block capacitors are operable to prevent a signal with a frequency of zero hertz from entering the switch. This exemplary embodiment or another exemplary embodiment may further provide wherein each of the GaN based transistors further comprise a transistor having at least one GaN channel layer disposed therein. This exemplary embodiment or another exemplary embodiment may further provide a first voltage gate in operable connection with the first output; and a second voltage gate in operable connection with the second output. This exemplary embodiment or another exemplary embodiment may further provide wherein when the first voltage gate has a zero voltage, the first output is on and when the first voltage gate has a voltage of negative twenty, the first output is in an off-state; and wherein when the second voltage gate has a zero voltage, the second output is on and when the second voltage gate has a voltage of negative twenty, the second output is in an off-state. This exemplary embodiment or another exemplary embodiment may further provide wherein when the first and second outputs are on, the at least one GaN based transistors in operable connection therewith act as capacitors and when the first and second outputs are in the off-state, the at least one GaN based transistors in operable connection therewith act as resistors. This exemplary embodiment or another exemplary embodiment may further provide wherein the first and second outputs are reflective. This exemplary embodiment or another exemplary embodiment may further provide wherein the switch is operable to provide a bandwidth ratio of at least 10:1 through 50 GHz.

In another aspect, an exemplary embodiment of the present disclosure may provide a differential switch comprising: an input; a first output having at least one gallium nitride (GaN) based transistor in operable connection therewith; and a second output at least one additional GaN based transistor in operable connection therewith. This exemplary embodiment or another exemplary embodiment may further provide wherein each of the GaN based transistors further comprise a transistor having at least one GaN channel layer disposed therein. This exemplary embodiment or another exemplary embodiment may further provide a first voltage gate in operable connection with the first output; and a second voltage gate in operable connection with the second output. This exemplary embodiment or another exemplary embodiment may further provide wherein when the first voltage gate has a zero voltage, the first output is on and when the first voltage gate has a voltage of negative twenty, the first output is in an off-state; and wherein when the second voltage gate has a zero voltage, the second output is on and when the second voltage gate has a voltage of negative twenty, the second output is in an off-state. This exemplary embodiment or another exemplary embodiment may further provide wherein when the first and second outputs are on, the at least one GaN based transistors in operable connection therewith act as capacitors and when the first and second outputs are in the off-state, the at least one GaN based transistors in operable connection therewith act as resistors. This exemplary embodiment or another exemplary embodiment may further provide wherein the first and second outputs are reflective.

In yet another aspect, an exemplary embodiment of the present disclosure may provide a differential switch comprising: an input; a first output having at least one gallium nitride (GaN) based transistor in operable connection therewith; a second output at least one additional GaN based transistor in operable connection therewith; and at least one transistor cell operably connected to each GaN based transistor in operable connection with the first and second outputs. This exemplary embodiment or another exemplary embodiment may further provide wherein each of the GaN based transistors further comprise a transistor having at least one GaN channel layer disposed therein. This exemplary embodiment or another exemplary embodiment may further provide a first voltage gate in operable connection with the first output; and a second voltage gate in operable connection with the second output. This exemplary embodiment or another exemplary embodiment may further provide wherein when the first voltage gate has a zero voltage, the first output is on and when the first voltage gate has a voltage of negative twenty, the first output is in an off-state; and wherein when the second voltage gate has a zero voltage, the second output is on and when the second voltage gate has a voltage of negative twenty, the second output is in an off-state. This exemplary embodiment or another exemplary embodiment may further provide wherein when the first and second outputs are on, the at least one GaN based transistors in operable connection therewith act as capacitors and when the first and second outputs are in the off-state, the at least one GaN based transistors in operable connection therewith act as resistors. This exemplary embodiment or another exemplary embodiment may further provide wherein the first and second outputs are absorptive.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
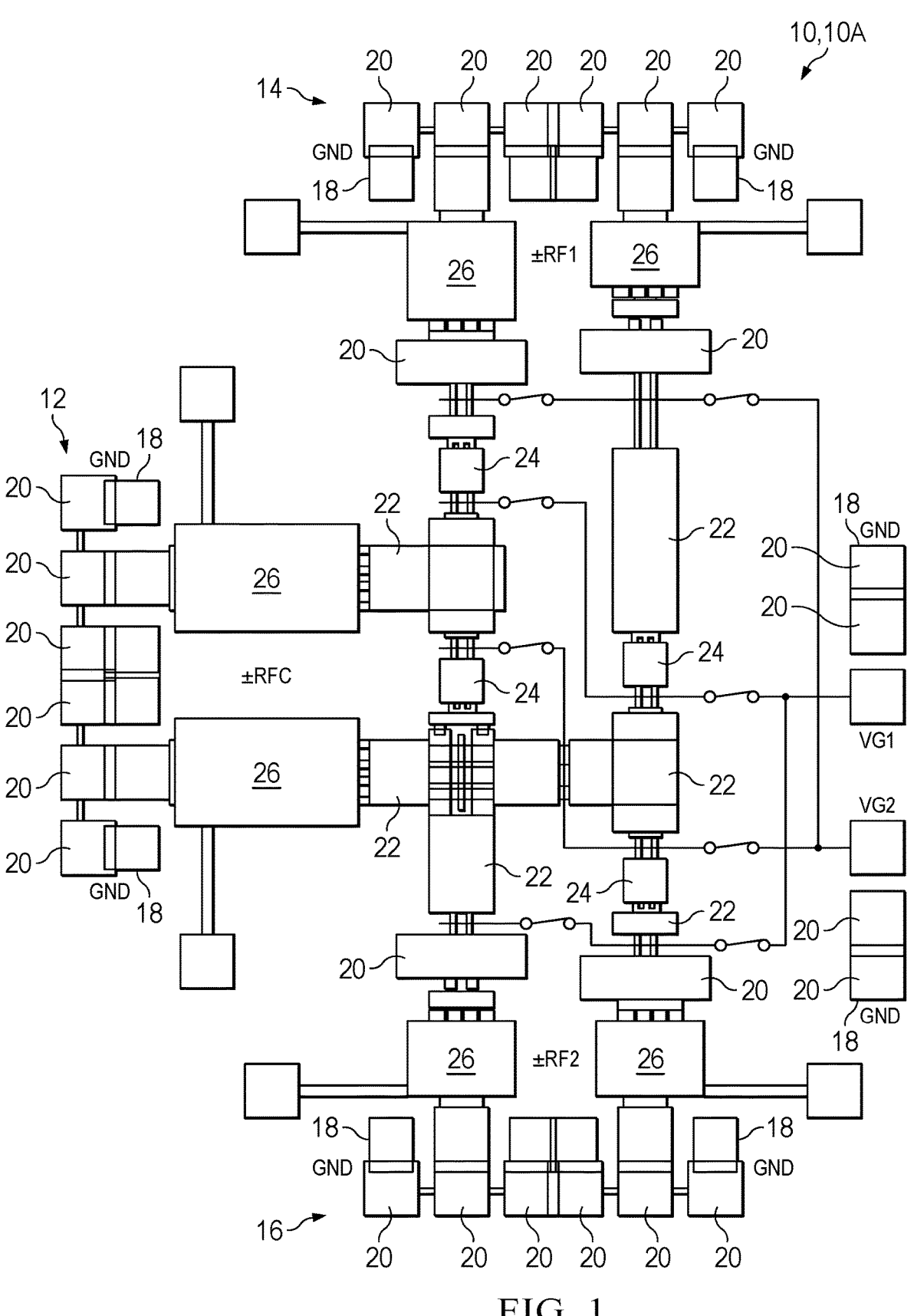
FIG. 1 is a schematic block diagram of a first embodiment of a high power differential switch, according to one aspect of the present disclosure.
Figure 2:
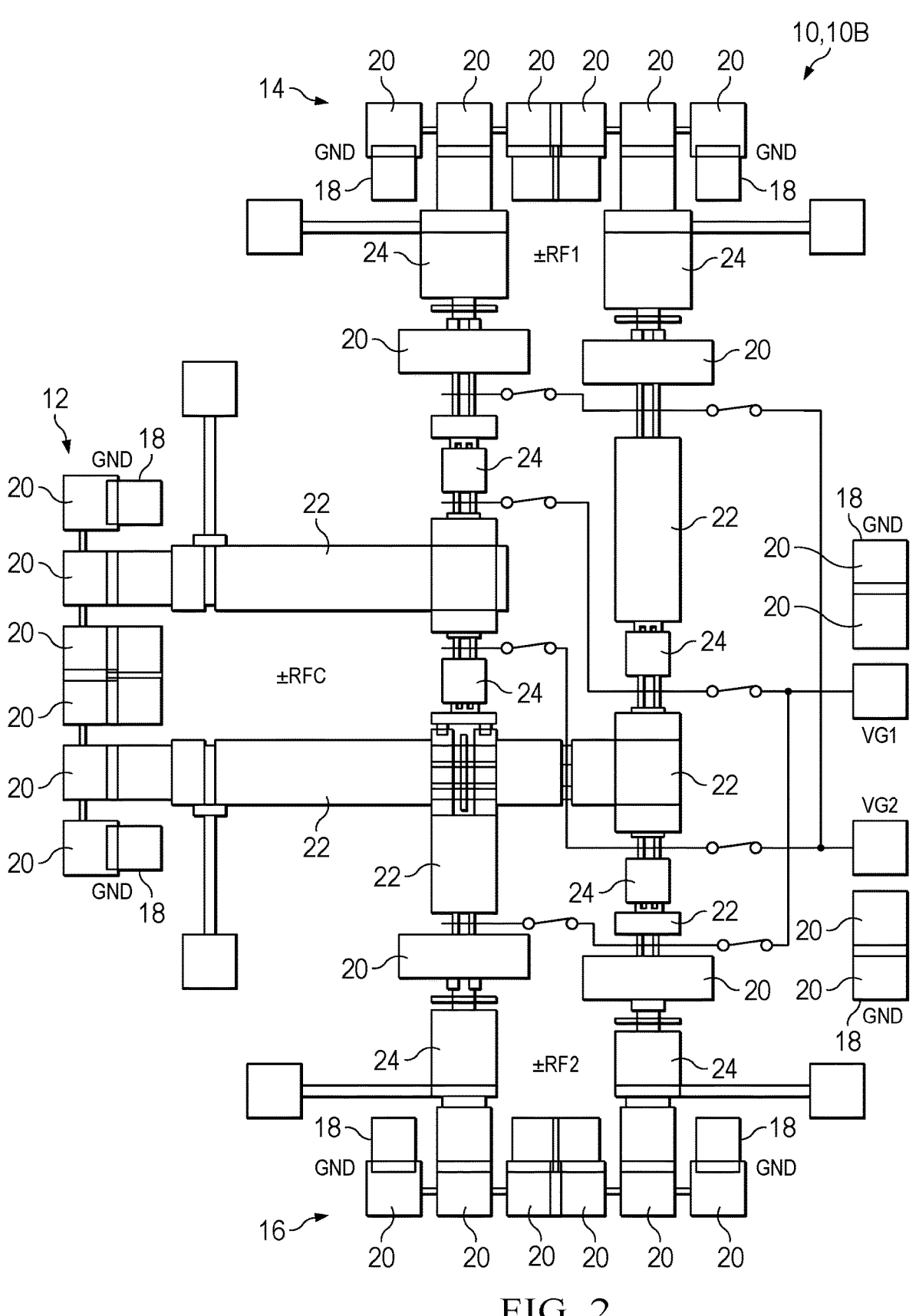
FIG. 2 is a schematic block diagram of a second embodiment of a high power differential switch, according to one aspect of the present disclosure.
Figure 3:
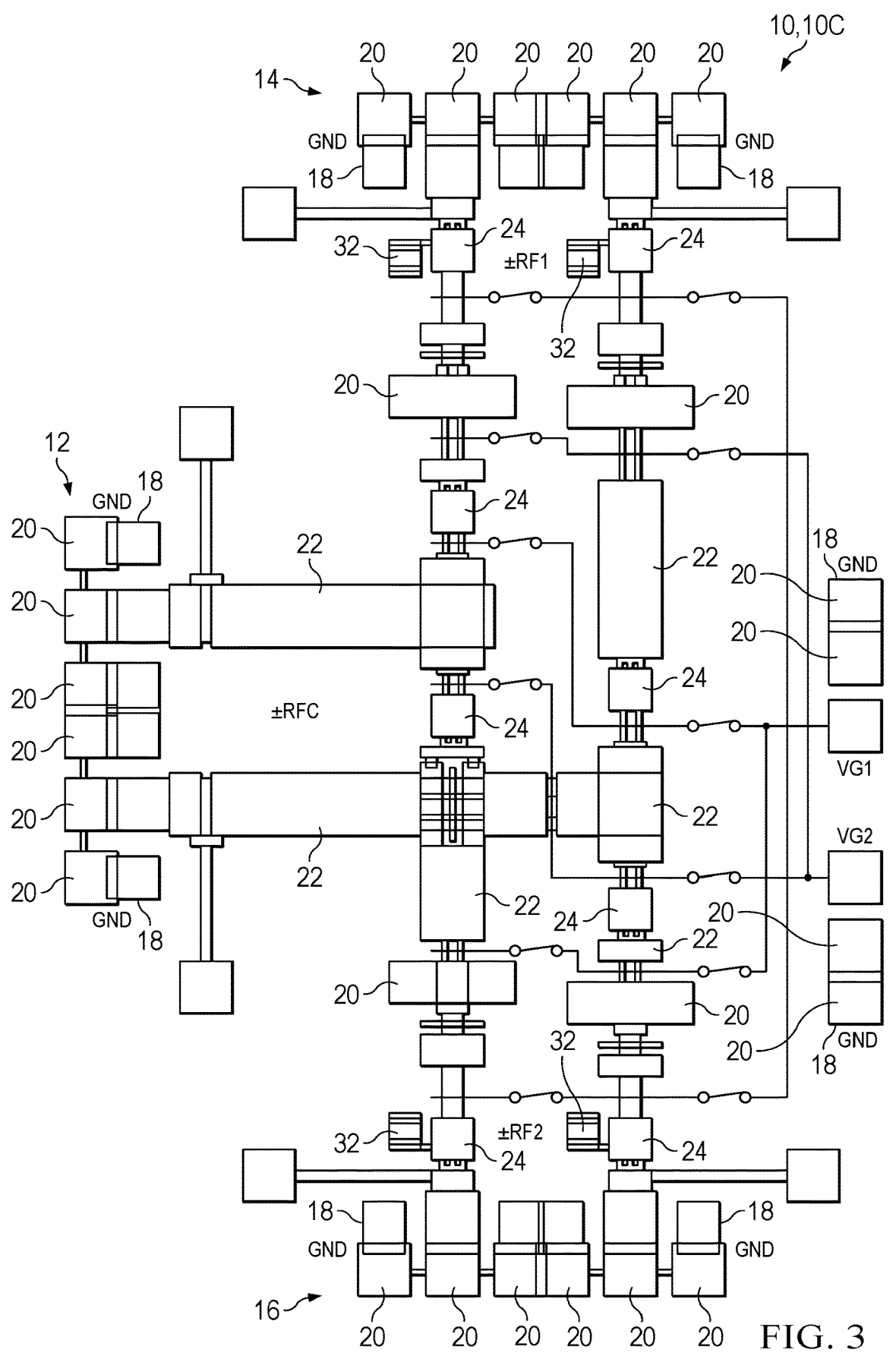
FIG. 3 is a schematic block diagram of a third embodiment of a high power differential switch, according to one aspect of the present disclosure.

With reference generally to FIGS. 1-3, exemplary differential switches are shown and generally indicated at reference 10. In particular, FIGS. 1-3 show three different embodiments of differential switch 10, respectively labeled as switches 10A (FIG. 1), 10B (FIG. 2), and 10C (FIG. 3). As described herein, all three differential switches 10 will be discussed generally with each individual element and component being present or applicable to each of the first, second, and third embodiments 10A, 10B, and/or 10C unless explicitly stated otherwise. It will therefore be understood that the first, second, and third embodiments 10A, 10B, and 10C of differential switch 10 are substantially similar and share many features, elements, and components, and are utilized similarly in operation. The specific differences between the embodiments will be explicitly called out herein.

Generally speaking, differential switch 10 may be a monolithic microwave integrated circuit (MMIC) differential single pole double throw switch having an input 12 and a pair of outputs, namely, first output 14, generally referring to the upper half of switches 10 in FIGS. 1-3, and a second output 16, generally referring to the lower half of switches 10 in FIGS. 1-3. Both first and second outputs 14 and 16 may be substantially similar or identical but for their placement and direction within differential switch 10. According to one aspect, first and second outputs 14 and 16 may be mirror images of each other with first output 14 extending in a first direction away from input 12 and a second output 16 extending in an opposite direction away from input 12. It will be understood, however, that the specific placement and configuration of the components of differential switch 10, including the location and position of input 12, first output 14, and second output 16 may vary as desired and/or as dictated by the desired implementation of differential switch 10.

As mentioned above and discussed further herein, since first output 14 and second output 16 may be substantially similar or identical but for their placement, it will be understood that the components and elements therein may be substantially similar or identical as well.

With reference now to FIG. 1, first embodiment of differential switch 10A will be described, again with the understanding that the other embodiments 10B and 10C may be similar unless specifically stated otherwise. Accordingly, differential switch 10A may include a series of ground pads or ground connectors, simply referred to as ground(s) 18, one or more vias 19, one or more bond pads 20, one or more resistors 21 one or more transmission lines 22, and one or more transistors 24. Differential switch 10A may further include one or more direct current (DC) block capacitors 26, a first voltage gate 28 indicated at VG1, and a second voltage gate 30 indicated at VG2. Although shown and described herein as having a specific placement and arrangement within differential switch 10A, each of these components may be arranged according to the desired implementation or the dictated parameters of the desired implementation.

Vias 19 may be standard electrical connection through holes defined in the switch 10, 10A and may be lined with any suitable conductive material. According to one aspect, vias 19 may be lined with copper. Vias 19 may be in operable connection with one or more resistors 21 which may connect the vias 19 to the DC blocks 26 and/or transmission lines 22, as desired. Vias 19 may be utilized to allow for electrical connections with other components on other levels or in layered configurations, and may be further provided to help stabilize (along with resistors 21) the transmission lines 22 to regulate any DC voltages that may leak through DC blocks 26 or may otherwise be present within the switch 10, 10A.

Bond pads 20 may be any suitable bonding surface operable to connect the switch 10 to an associated adjacent component, such as a transmitter, transformer, transceiver, or other suitable device. Bond pads 20 may vary in number, orientation, placement, and size depending on the pin design and layout of the associated component, and may vary further depending upon the desired implementation of switch 10. According to one aspect, differential switch 10, 10A may have a series of bond pads 20 connected to one or more grounds 18 at or near the input 12 operable to connect the input 12 of differential switch 10, 10A to a signal source.

Resistors 21, as mentioned above, may connect transmission lines 22 and vias 19 and may further facilitate the regulation of DC voltages within switch 10, 10A. Resistors 21 may be any suitable, commercially available components, as desired or dictated by the specific implementation of switch 10, 1A.

Transmission lines 22 may be any suitable circuitry, wiring, or the like operable to move the signal through differential switch 10, 10A, as desired. According to one aspect, transmission lines 22 may be printed circuits on a printed circuit board. According to another aspect, transmission lines 22 may be microstrips, striplines, or coplanar lines, as dictated by the desired implementation. Transmission lines 22 may travel in any suitable path and have any suitable layout as desired, provided they can direct a signal from the input 12 through one or both of the outputs 14 and/or 16, as discussed further herein.

Transistors 24 may be a gallium nitride (GaN) based circuit transistors designed for use in MMIC switches, such as differential switch 10. Transistors 24 may be better understood in relation to their GaN foundry process, and will be discussed in more detail below.

DC block capacitors 26, or DC blocks, may be capacitors operable to block the flow of DC signals (signals having a frequency of approximately zero Hz) while allowing higher frequency signals to pass through. DC blocks 26 may be any suitable and standard DC block capacitor, including inner blocks, outer blocks, or combination inner and out blocks, as desired. DC blocks 26 may operate according to standard methods to regulate or filter the signal moving into and through switch 10A. In later embodiments 10B and 10C, as discussed below, DC blocks 26 may be omitted, which may allow for a wider operational frequency bandwidth, but at the cost of potentially increased signal interference in some instances.

DC blocks 26 may be operationally connected to transmission lines 22 and may filter or otherwise regulate the signal as it moves between the bond pads 20 and the transistors 24, as discussed below.

The path of a signal moving through switch 10, 10A may travel from input 12 and through first output 14 or second output 16. The determination of which output 14 or 16 is open to the signal can be made using first voltage gate 28 and second voltage gate 30 utilizing a simple truth table represented here:

TABLE 1

| VG1 (V) | VG2 (V) | State |
|---------|---------|-----------|
| −20 | −20 | All Off |
| −20 | 0 | RF2 On |
| 0 | −20 | RF1 On |
| 0 | 0 | Undefined |

Specifically, as seen in Table 1 above, when both voltage gates 28 and 30 are provided with a negative 20-volt charge, the differential switch 10, 10A is switched off and no signal will pass through either output 12 or 14. Where first voltage gate 28 maintains a negative 20 voltage and second voltage gate 30 has a voltage of zero, the second output 16 is turned on and the signal will be directed towards second output 16. Where the charges are reversed, i.e. second voltage gate 30 has a negative 20 voltage while first voltage gate 28 has a zero voltage, first output 14 may be switched on and the signal will be directed towards first output 14. Where both voltage gates 28 and 30 are at zero voltage, the state of differential switch 10, 10A is undefined as the signal will travel freely through switch 10, 10A unimpeded. The voltage gating of first and second outputs 14 and 16 may allow transistors 24 to act as resistors or as capacitors as determined by the voltage at each of first and second voltage gates 28 and 30.

First and second voltage gates 28 and 30 may therefore be any suitable voltage gated driver circuit or any other suitable device operable to direct a signal through switch 10, as described herein.

The construction and arrangement of differential switches 10, 10A, 10B, and/or 10C may be further understood by the operation of switches 10, 10A, 10B, and/or 10C as a signal moves therethrough, and will be described further below.

As illustrated, differential switch 10A may be or otherwise have a series/shunt topology with all devices contained therein being 4×100 μm devices with each port being DC blocked. According to this example, series devices connected through switch 10A may have a max power rating of approximately 10 watts while shunt devices may have a max power rating of approximately 9 watts of RF power, which represents a significant increase over other commercially available switches handling only up to three or four watts. One exemplary use of differential switch 10A, according to one aspect, may be with transformers to go from single-ended ports to differential inputs and/or outputs.

With reference to FIG. 2, a second embodiment of differential switch 10 is shown and generally indicated as differential switch 10B. As mentioned above, switch 10B may be substantially similar or identical to switch 10A and may include an input 12, a first output 14, a second output 16, a series of grounds 18, a plurality of bond pads 20, a plurality of transmission lines 22, and a series of transistors 24. Differential switch 10B may differ from differential switch 10A in that differential switch 10B may omit the DC block capacitors 26 and may allow the signal to pass unfiltered or unaltered through the switch via transmission lines 22, as desired. Although not illustrated and not discussed in detail herein, a combination of switch 10A and 10B may be utilized, according to the desired implementation, wherein one port may be DC blocked utilizing DC block capacitors 26 while the other port may be unblocked.

As with differential switch 10A, differential switch 10B may be a series/shunt topology switch utilizing 4×100 μm devices with a max power of approximately 10 watts for series devices and a max power of approximately 9 Watts for shunt devices used therewith. Similarly, according to one example, switch 10B may be utilized in association with transformers or the like to go from single-ended ports to differential inputs and/or outputs.

Both first and second embodiments of differential switches 10A and 10B may be reflective switches in that whichever output 14 or 16 is not actively selected may be a reflective arm that is operable to direct all power back towards the input 12 and/or to the other active output 14 or 16.

With reference to FIG. 3, a third embodiment of differential switch 10 is shown and generally indicated as differential switch 10C. As mentioned above, switch 10C may be substantially similar or identical to switches 10A and 10B in that it may also include an input 12, a first output 14, a second output 16, a series of grounds 18, a plurality of bond pads 20, a plurality of transmission lines 22, and a series of transistors 24. Differential switch 10C may differ from differential switch 10A in that differential switch 10C may omit the DC block capacitors 26 and may allow the signal to pass through the switch via transmission lines 22, as desired. Differential switch 10C may differ from differential switch 10B in that switch 10C may further include one or more transistor cells 32 associated with one or more of the transistors 24.

Transistor cells 32 may be any suitable commercially available transistor cells. Their association with the GaN formed transistors 24 may provide that the third embodiment 10C of switch 10 is absorptive (power directed to the off-state output is absorbed rather than reflected back) and has an improved off-state impedance match as compared to first and second switches 10A and 10B.

Although not illustrated and not discussed in detail herein, combinations of switches 10A, 10B, and/or 10C might be utilized, according to the desired implementation, output ports may be selectively DC blocked and/or may incorporate transistor cells as desired.

As with differential switches 10A and 10B, differential switch 10C may likewise be a series/shunt topology switch utilizing 4×100 μm devices with a max power of approximately 10 watts for series devices and a max power of approximately 9 watts for shunt devices used therewith. Similarly, according to one example, switch 10C may be utilized in association with transformers or the like to go from single-ended ports to differential inputs and/or outputs.

Any or all of differential switches 10 may be utilized with or in communication with suitable legacy systems which may be retrofitted or adapted to utilize the disclosed switches 10 without significantly increasing size, weight, power, or cost to existing legacy systems. Alternatively, switches 10 of the present disclosure may be incorporated into legacy systems to replace existing switches and/or singularly configured transmit and receive chains with little to no modification thereto while providing the benefits of increased frequency ranges and power handling capabilities without requiring adjustments or further modifications to these legacy systems.

Figure 4:
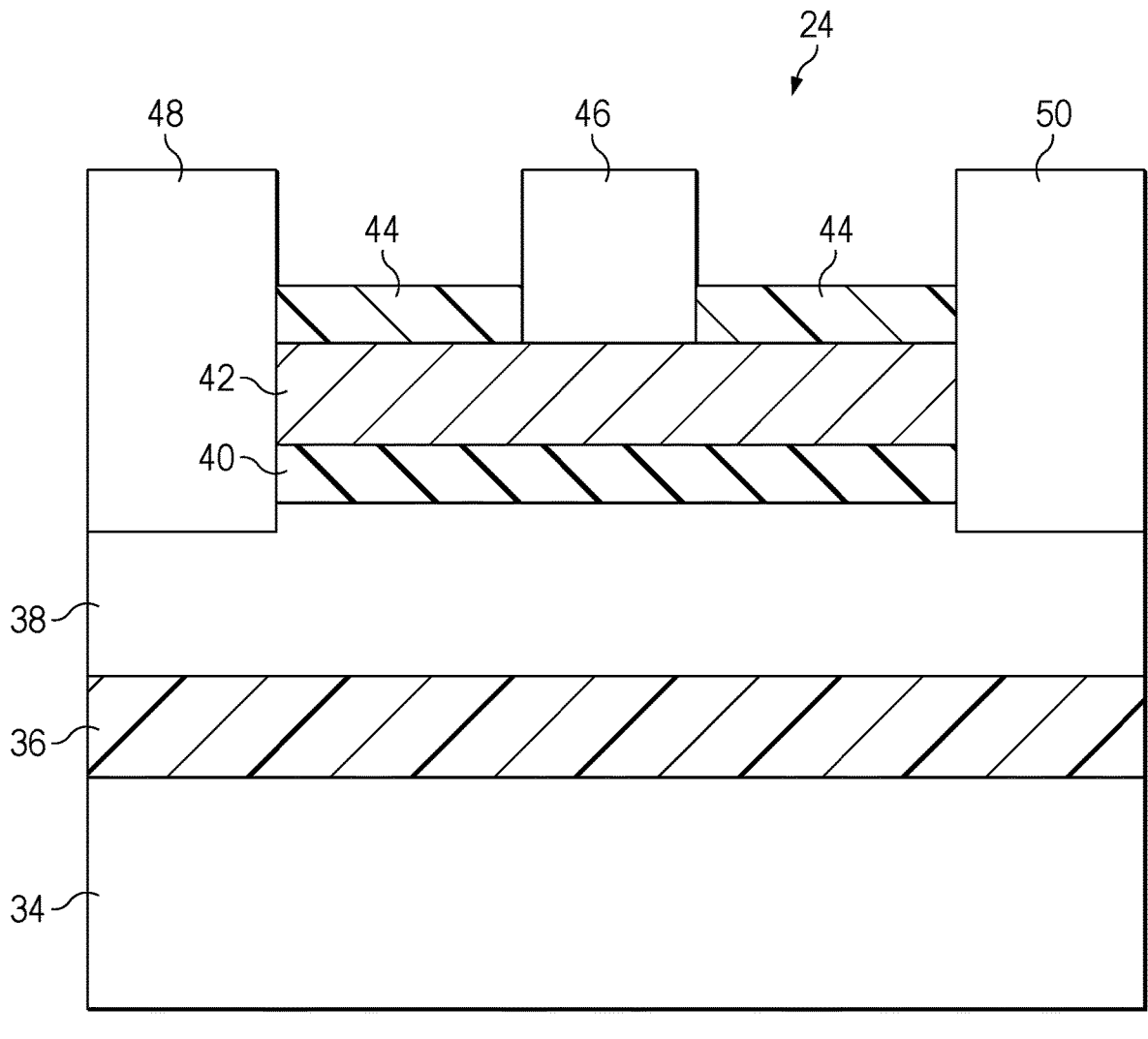
FIG. 4 is a cross sectional view of an exemplary transistor, according to one aspect of the present disclosure.

With reference now to FIG. 4, a cross section of an exemplary transistor 24 is shown and will now be described. This cross section and transistor 24 as shown is considered exemplary for the reason that a transistor utilized within differential switch 10 may be or otherwise generally have a structure similar to that which is shown in FIG. 4; however, a person of skill may readily modify or adapt the specific layout and/or arrangement of components of transistor 24, as dictated by the desired implementation. Put another way, the transistor 24 shown will be understood as exemplary because it is not required to have the exact form and structure as shown, but instead can be adapted for the desired implementation.

As shown, transistor 24 may be formed utilizing a gallium nitride (GaN) foundry process. It is found that GaN-based circuit designs for use in MMICs, such as differential switch 10, may enable the benefits described herein, namely, improved power handling capabilities and larger dynamic frequency ranges. These improvements are recognized over industry standard silicone-based circuit designs.

Transistors 24 formed by GaN foundry services may be commercially obtained through BAE Systems, Inc. foundry services or may be obtained through other commercial GaN foundry services suppliers.

According to one aspect, an exemplary transistor 24 may include a substrate layer 34, which may be formed of any suitable substrate material including, but not limited to, silicon carbide or the like. This substrate 34 may allow for growth of the transistor 24 thereon including a nucleation layer 36, a GaN channel layer 38, a spacer layer 40, and barrier layer 42. These layers, other than GaN channel layer 38, may be formed of any suitable materials including aluminum nitride, aluminum/gallium nitride composites, or any other suitable materials as dictated by the desired implementation.

Transistor 24 may further include a cap layer 44 separating the barrier layer 42 from the installation environment of differential switch 10. Transistor 24 may further include a gate 46, a source or source connector 48, and a drain or drain connector 50, which may be operated according to standard and normal operations of transistor elements. Again, as mentioned above, the construction and use of gallium nitride-based channel layers such as channel layer 38 and/or other layers, such as barrier layer 42 or the like, may provide the benefits described and discussed further herein with regards to the operational performance of differential switch 10.

Accordingly, having thus described the elements and components of differential switch 10, the operation and use thereof, including the benefits realized therefrom, will now be described. This operation may be best understood through tracing a signal traveling through switch 10.

As mentioned above, each of differential switch 10 embodiments 10A, 10B, and/or 10C may operate substantially similar in that a signal may travel through input 12 and out through one of first and/or second outputs 14 and/or 16, as desired. The output 14 or 16 through which signal may travel may again be determined by the voltage applied to voltage gates 28 and/or 30, as discussed herein.

As the signal travels through differential switch 10, it is carried by transmission lines 22 between various components including through transistors 24. These transistors may act in a dual capacity as either a resistor or a capacitor depending on the voltage at first and second voltage gates 28 and 30, as illustrated in Table 1 and discussed above.

Transistors 24, as designed and discussed herein, being gallium nitride-based transistors, may allow for improved performance across all three embodiments 10A, 10B, and/or 10C of differential switch 10, which may allow for an increased frequency range, better isolation, and better power handling as compared to prior art differential switches. Similarly, these performance improvements may be realized while maintaining similar and/or similarly acceptable insertion loss and amplitude matching properties. Further preliminary testing appears to indicate that settling time and group delay may be similarly improved.

As provided below in Table 2, first embodiment of differential switch 10A may allow for an operating frequency range from approximately two to over 18 GHz. Second and third embodiments 10B and 10C may provide a range from DC up to and above 20 GHz of operational frequency range. According to one aspect, all embodiments of differential switch 10 may be operable up to and through 50 GHz with a bandwidth ratio of 10:1 or greater.

Table 2 further includes four readily available and easily obtained commercial off-the-shelf (COTS) design differential switches, labeled as COTS 1-COTS 4. As compared to these COTS designs, all three embodiments 10A, 10C, and 10C demonstrate a marked improvement in frequency range as the COTS designs have a maximum frequency range of near DC to approximately 6 GHz on the high end. Similarly, power consumption is improved, with each of first, second, and third embodiments 10A, 10B, and 10C of differential switch 10 having an approximate 9 watts power handling rating while COTS designs are limited to 4 watts or less of power handling capability.

TABLE 2

|  | Switch 10A | Switch 10B | Switch 10C | COTS 1 | COTS 2 | COTS 3 | COTS 4 |
|---|---|---|---|---|---|---|---|
| Frequency Range | 2-18+ GHz | DC-20 GHz | DC-20 GHz | 0.6-6 GHz | 0.05-2.7 GHz | 0.6-3 GHz | 0.1-3 GHz |
| Insertion Loss | 1.3 dB | 1.2 dB | 1.6 dB | 1.65 dB | 0.5 dB | 0.5 dB | 0.6 dB |
| Isolation | 26 dB | 26 dB | 34 dB | 29 dB | 25 dB | 16 dB | 19 dB |
| Power Handling | 9 W | 9 W | 9 W | 2 W | 4 W | <1 W | 1 W |

In operation, each embodiment of differential switch 10 may be generally operated according to known differential switch functionality. This may allow differential switch 10, and all embodiments thereof, to be adapted for use in legacy systems with minimal or no modifications thereto as differential switch 10 may simply replace current commercial off the shelf switches that may be in use. This adaptability and flexibility may further allow use of differential switch 10 in other suitable applications as desired or dictated by the desired implementation thereof.

According to one non-limiting example, differential switch 10 may be incorporated into a transmit and/or receiver chain between an antenna or antenna array and other receiver components. In this exemplary implementation, differential switch 10 may be operable to switch the operation of the antenna between a transmission function and a receiver function. This may allow the same antenna element and/or array to be used in both a transmission mode and a receiver mode, which may further reduce operating costs, maintenance, and operable size of such a system by sharing elements between the two modes.

In either mode (transmit or receive), any embodiment of differential switch 10 may be implemented according to the desired characteristics and performance of the associated system. As seen in Table 2 and as discussed herein, each embodiment of switch 10 (e.g. 10A, 10B, and 10C) may offer different performance capabilities. The determination of which embodiment to employ may therefore be made based on these specific capabilities and functionality, as desired.

As described herein, aspects of the present disclosure may include one or more electrical, pneumatic, hydraulic, or other similar secondary components and/or systems therein. The present disclosure is therefore contemplated and will be understood to include any necessary operational components thereof. For example, electrical components will be understood to include any suitable and necessary wiring, fuses, or the like for normal operation thereof. Similarly, any pneumatic systems provided may include any secondary or peripheral components such as air hoses, compressors, valves, meters, or the like. It will be further understood that any connections between various components not explicitly described herein may be made through any suitable means including mechanical fasteners, or more permanent attachment means, such as welding or the like. Alternatively, where feasible and/or desirable, various components of the present disclosure may be integrally formed as a single unit.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A differential switch comprising:
an input;
a first output having at least one gallium nitride (GaN) based transistor in operable connection therewith;
a second output having at least one additional GaN based transistor in operable connection therewith;
a first voltage gate in operable connection with the first output; and
a second voltage gate in operable connection with the second output;
wherein when the first voltage gate has a zero voltage, the first output is on and when the first voltage gate has a voltage of negative twenty volts, the first output is in an off-state; and
wherein when the second voltage gate has a zero voltage, the second output is on and when the second voltage gate has a voltage of negative twenty volts, the second output is in an off-state.

2. The differential switch of claim 1 further comprising:
at least three direct current (DC) block capacitors, with at least one of the at least three DC block capacitors in operable connection with the input, at least one of the at least three DC block capacitors in operable connection with the first output, and at least one of the at least three DC block capacitors in operable connection with the second output.

3. The differential switch of claim 2 wherein the at least three DC block capacitors are operable to prevent a signal with a frequency of zero hertz from entering the differential switch.

4. The differential switch of claim 1 wherein the at least one GaN based transistor in operable connection with the first output and the at least one additional GaN based transistor in operable communication with the second output further comprise a transistor having at least one GaN channel layer disposed therein.

5. The differential switch of claim 1 wherein when the first and second outputs are on, the at least one GaN based transistor in operable connection with the first output and the at least one additional GaN based transistor in operable communication with the second output act as capacitors and when the first and second outputs are in the off-state, the at least one GaN based transistor in operable connection with the first output and the at least one additional GaN based transistor in operable communication with the second output act as resistors.

6. The differential switch of claim 1 wherein the first and second outputs are reflective.

7. The differential switch of claim 1 wherein the differential switch is operable to provide a bandwidth ratio of at least 10:1 up to and through 50 GHz.

8. A receiver chain comprising:
at least one antenna operable to transmit and receive a signal; and
a differential switch operable to switch the at least one antenna between a transmitting mode and a receiving mode, the differential switch further comprising:
an input;
a first output having at least one gallium nitride (GaN) based transistor in operable connection therewith; and
a second output having at least one additional GaN based transistor in operable connection therewith;
wherein the differential switch further comprises:
a first voltage gate in operable connection with the first output; and
a second voltage gate in operable connection with the second output;
wherein when the first voltage gate has a zero voltage, the first output is on and when the first voltage gate has a voltage of negative twenty volts, the first output is in an off-state; and
wherein when the second voltage gate has a zero voltage, the second output is on and when the second voltage gate has a voltage of negative twenty volts, the second output is in an off-state.

9. The receiver chain of claim 8 wherein the at least one GaN based transistor in operable connection with the first output and the at least one additional GaN based transistor in operable communication with the second output further comprise a transistor having at least one GaN channel layer disposed therein.

10. The receiver chain of claim 8 wherein when the first and second outputs are on the at least one GaN based transistor in operable connection with the first output and the at least one additional GaN based transistor in operable communication with the second output act as capacitors and when the first and second outputs are in the off-state, the at least one GaN based transistor in operable connection with the first output and the at least one additional GaN based transistor in operable communication with the second output act as resistors.

11. The differential switch of claim 8 wherein the first and second outputs are reflective.

12. A differential switch comprising:
an input;
a first output having at least one gallium nitride (GaN) based transistor in operable connection therewith;
a second output having at least one additional GaN based transistor in operable connection therewith;
at least one transistor cell operably connected to the at least one GaN based transistor in operable connection with the first output and the at least one additional GaN based transistor in operable communication with the second output; connection with the first and second outputs;

a first voltage gate in operable connection with the first output; and a second voltage gate in operable connection with the second output;

wherein when the first voltage gate has a zero voltage, the first output is on and when the first voltage gate has a voltage of negative twenty volts, the first output is in an off-state; and wherein when the second voltage gate has a zero voltage, the second output is on and when the second voltage gate has a voltage of negative twenty volts, the second output is in an off-state.

13. The differential switch of claim 12 wherein the at least one GaN based transistor in operable connection with the first output and the at least one additional GaN based transistor in operable communication with the second output further comprise a transistor having at least one GaN channel layer disposed therein.

14. The differential switch of claim 12 wherein when the first and second outputs are on, the at least one GaN based transistor in operable connection with the first output and the at least one additional GaN based transistor in operable communication with the second output act as capacitors and when the first and second outputs are in the off-state, the at least one GaN based transistors in operable connection therewith act as resistors.

15. The differential switch of claim 12 wherein the first and second outputs are absorptive.

\* \* \* \* \*